(12) United States Patent
Hung et al.

(10) Patent No.: US 9,179,567 B2
(45) Date of Patent: Nov. 3, 2015

(54) ELECTRONIC DEVICE

(71) Applicants: Cheng-Chih Hung, Taipei (TW);
Chao-Ming Chu, Taipei (TW);
Szu-Tang Chiu, Taipei (TW)

(72) Inventors: Cheng-Chih Hung, Taipei (TW);
Chao-Ming Chu, Taipei (TW);
Szu-Tang Chiu, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 234 days.

(21) Appl. No.: 13/868,124

(22) Filed: Apr. 23, 2013

(65) Prior Publication Data

US 2013/0314858 A1  Nov. 28, 2013

Related U.S. Application Data

(60) Provisional application No. 61/650,490, filed on May 23, 2012, provisional application No. 61/725,032, filed on Nov. 12, 2012.

(30) Foreign Application Priority Data

Mar. 14, 2013  (TW) .............................. 102109077 A (51) Int. Cl.
*H05K 7/02* (2006.01)
*G06F 1/16* (2006.01)

(52) U.S. Cl.
CPC *H05K 7/02* (2013.01); *G06F 1/166* (2013.01); *G06F 1/1624* (2013.01); *G06F 1/1679* (2013.01)

(58) Field of Classification Search
CPC ....................................................... H05K 7/02

USPC ............ 361/679.01–679.45, 679.55–679.61, 361/724–727, 728–747, 752–759, 361/796–837; 312/223.2, 7.1, 319.9, 333, 312/348.3, 222, 226; 248/309.1, 316.8, 248/917, 922, 923, 346.4
See application file for complete search history.

(56) References Cited

U.S. PATENT DOCUMENTS

| 4,142,737 A | | 3/1979 | Marsh et al. |
| 5,125,518 A | | 6/1992 | Ward |
| 5,235,495 A | * | 8/1993 | Blair et al. ............... 361/679.26 |
| 5,436,792 A | * | 7/1995 | Leman et al. ............. 361/679.44 |
| 5,751,548 A | * | 5/1998 | Hall et al. ................ 361/679.41 |
| 5,899,421 A | * | 5/1999 | Silverman ..................... 248/175 |
| 6,016,248 A | * | 1/2000 | Anzai et al. .............. 361/679.59 |
| 6,185,096 B1 | * | 2/2001 | Helot et al. .............. 361/679.44 |

(Continued)

FOREIGN PATENT DOCUMENTS

| CN | 1499393 | 5/2004 |
| TW | 587739 | 5/2004 |

(Continued)

*Primary Examiner* — Courtney Smith
*Assistant Examiner* — Rashen E Morrison
(74) *Attorney, Agent, or Firm* — Jianq Chyun IP Office (57) ABSTRACT

An electronic device having a calculation function and suitable for being detachably connected to a portable electronic device having a calculation function is provided. The electronic device includes a body, a connecting base and a supporter. The body has a first surface. The connecting base is disposed at the body and has a containing cavity. The portable electronic device is suitable for being disposed in the containing cavity to be electronically connected to the electronic device. A back surface of the portable electronic device leans against the first surface. The supporter is connected to the body and supports the body, and an angle is formed therebetween.

14 Claims, 10 Drawing Sheets

(56) References Cited

U.S. PATENT DOCUMENTS

| | | | |
|---|---|---|---|
| 6,208,734 B1 * | 3/2001 | Ortscheid et al. | 379/446 |
| 6,264,488 B1 * | 7/2001 | Helot et al. | 439/341 |
| 6,301,106 B1 * | 10/2001 | Helot et al. | 361/679.55 |
| 6,702,604 B1 * | 3/2004 | Moscovitch | 439/374 |
| 6,788,527 B2 * | 9/2004 | Doczy et al. | 361/679.11 |
| 6,952,340 B2 * | 10/2005 | Son et al. | 361/679.09 |
| 6,952,343 B2 * | 10/2005 | Sato | 361/679.57 |
| 6,975,507 B2 * | 12/2005 | Wang et al. | 361/679.21 |
| 7,035,094 B2 * | 4/2006 | Huang et al. | 361/679.55 |
| 7,052,296 B2 * | 5/2006 | Yang et al. | 439/165 |
| 7,396,233 B2 * | 7/2008 | Lin | 439/31 |
| 7,566,033 B2 * | 7/2009 | Schwager et al. | 248/125.9 |
| 7,762,519 B2 * | 7/2010 | Kunii et al. | 248/688 |
| 7,916,478 B2 * | 3/2011 | Tu et al. | 361/679.59 |
| 7,969,730 B1 * | 6/2011 | Doherty et al. | 361/679.54 |
| 8,072,744 B2 * | 12/2011 | Wang | 361/679.29 |
| 8,077,454 B2 * | 12/2011 | Ward et al. | 361/679.41 |
| 8,315,048 B2 * | 11/2012 | Tarnoff | 361/679.43 |
| 8,576,564 B2 * | 11/2013 | Murakata et al. | 361/679.59 |
| 8,644,018 B2 * | 2/2014 | Hung | 361/679.41 |
| 8,767,396 B2 * | 7/2014 | Shindo et al. | 361/679.59 |
| 8,824,134 B2 * | 9/2014 | Chu et al. | 361/679.4 |
| 8,911,246 B2 * | 12/2014 | Carnevali | 439/170 |
| 2004/0090742 A1 | 5/2004 | Son et al. | |
| 2004/0174671 A1 | 9/2004 | Huang et al. | |
| 2005/0083644 A1 * | 4/2005 | Song | 361/683 |
| 2005/0128695 A1 * | 6/2005 | Han | 361/683 |
| 2005/0280984 A1 * | 12/2005 | Huang et al. | 361/686 |
| 2007/0102378 A1 | 5/2007 | Innis | |
| 2008/0024975 A1 * | 1/2008 | Huang et al. | 361/686 |
| 2008/0304217 A1 * | 12/2008 | Lai et al. | 361/681 |
| 2009/0200378 A1 * | 8/2009 | Doherty et al. | 235/462.01 |
| 2009/0201636 A1 * | 8/2009 | Doherty et al. | 361/679.26 |
| 2010/0177467 A1 * | 7/2010 | Wang | 361/679.01 |
| 2010/0296260 A1 * | 11/2010 | Chiu | 361/807 |
| 2011/0299241 A1 * | 12/2011 | Chen | 361/679.55 |
| 2012/0001039 A1 | 1/2012 | McDuff et al. | |
| 2012/0044624 A1 * | 2/2012 | Hoffman et al. | 361/679.21 |
| 2012/0120563 A1 * | 5/2012 | Lai | 361/679.01 |
| 2012/0188701 A1 * | 7/2012 | Lu et al. | 361/679.26 |
| 2012/0206875 A1 * | 8/2012 | Carnevali | 361/679.41 |
| 2013/0087666 A1 * | 4/2013 | Chien et al. | 248/122.1 |
| 2013/0128469 A1 * | 5/2013 | Wang | 361/748 |
| 2013/0314858 A1 * | 11/2013 | Hung et al. | 361/679.01 |
| 2014/0268622 A1 * | 9/2014 | Chao | 361/809 |

FOREIGN PATENT DOCUMENTS

| | | |
|---|---|---|
| TW | M332880 | 5/2008 |
| TW | 201237628 | 9/2012 |

* cited by examiner

ELECTRONIC DEVICE

CROSS-REFERENCE TO RELATED APPLICATION

This application claims the priority benefits of U.S.A. provisional application Ser. No. 61/650,490, filed on May 23, 2012, U.S.A. provisional application Ser. No. 61/725,032, filed on Nov. 12, 2012, and Taiwan application serial no. 102109077, filed on Mar. 14, 2013. The entirety of each of the above-mentioned patent applications is hereby incorporated by reference herein and made a part of this specification.

BACKGROUND OF THE INVENTION

1. Field of the Invention

The invention relates to an electronic device and, more particularly, to an electronic device which can be detachably connected to a portable electronic device.

2. Description of the Related Art

As information age comes, computers are widely used. Conventionally, a desktop computer is concentrated on performance, and it is seldom moved. Thus, the desktop computer usually has a large size and a heavy weight, and occupies much space on the desk. Moreover, since the desktop computer is connected to a display device via a cable, the position of the display device is limited by the length of the cable. As science technology develops, electronic products become lighter and thinner. Many electronic devices which are smaller and lighter than the desktop computer, such a notebook computer, a tablet computer and an all-in-one (AIO) computer, become popular in the electronic market.

Taking the AIO computer as an example, it includes a display device and a host fixed at a back surface of the display device. The display device is usually fixed in a casing of the host. When the user wants to repair or move the display device, he or she should detach the casing of the host and unlock the display device. Thus, it is inconvenient for the user to repair and move the display device.

BRIEF SUMMARY OF THE INVENTION

An electronic device detachably connected to a portable electronic device is provided.

The electronic device having a calculation function is detachably connected to the portable electronic device having the calculation function. The electronic device includes a body, a connecting base and a supporter. The body has a first surface. The connecting base is disposed at the body and includes a containing cavity. A bottom surface of the containing cavity is vertical to the first surface. The portable electronic device is capable of being disposed in the containing cavity to be electrically connected to the electronic device. A back surface of the portable electronic device leans against the first surface. The supporter is disposed at the body and supports the body, and an angle is formed therebetween.

To sum up, the connecting base is disposed at the electronic device to make the bottom surface of the connecting base substantially vertical to the first surface of the electronic device. The connecting base includes the containing cavity for holding the portable electronic device. Thus, the portable electronic device can be detachably and electrically connected to the electronic device via the connecting base. When the electronic device is electrically connected to the portable electronic device, the one with better calculation function takes charge of the main processing and calculation. Thus, the mobility, the functionality and the flexibility of the electronic device and the portable electronic device are improved.

These and other features, aspects and advantages of the present invention will become better understood with regard to the following description, appended claims, and accompanying drawings.

DETAILED DESCRIPTION OF THE EMBODIMENTS

Figure 1:
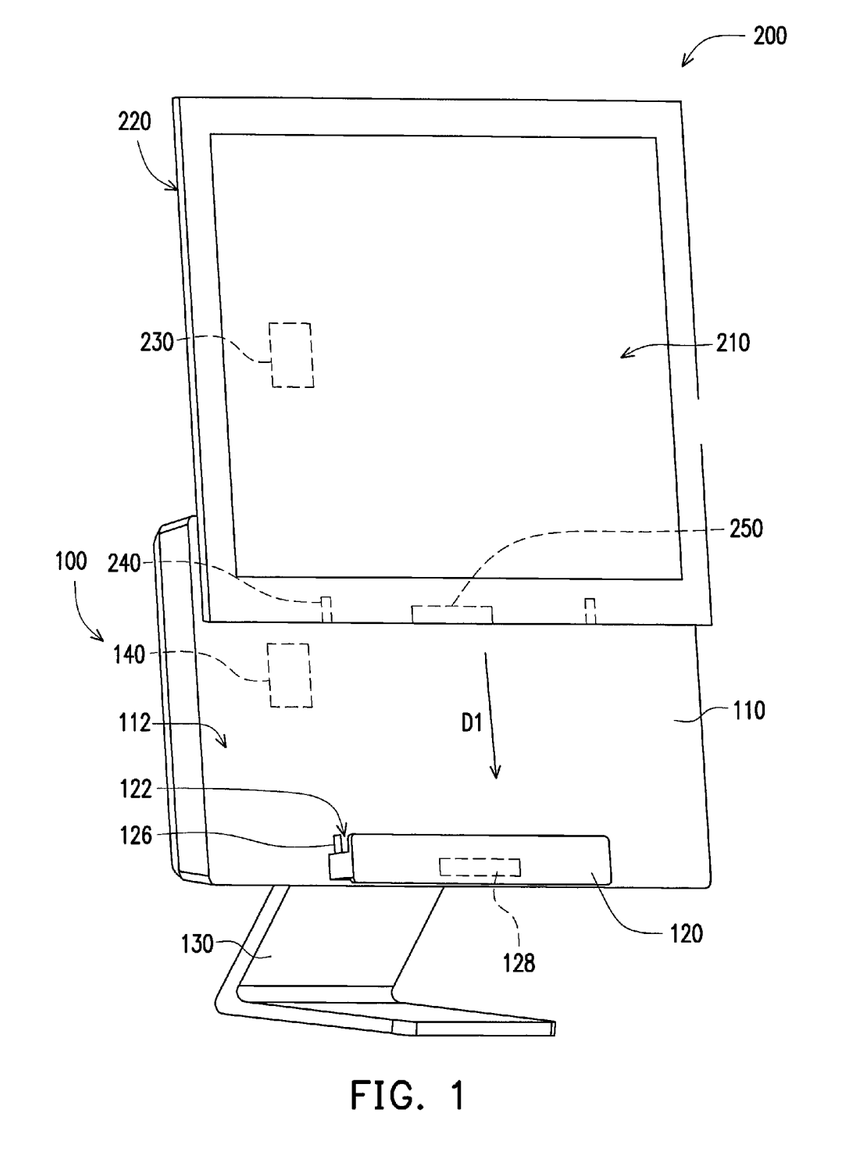
FIG. 1 is a schematic diagram showing an electronic device and a portable electronic device in a first embodiment.
Figure 2:
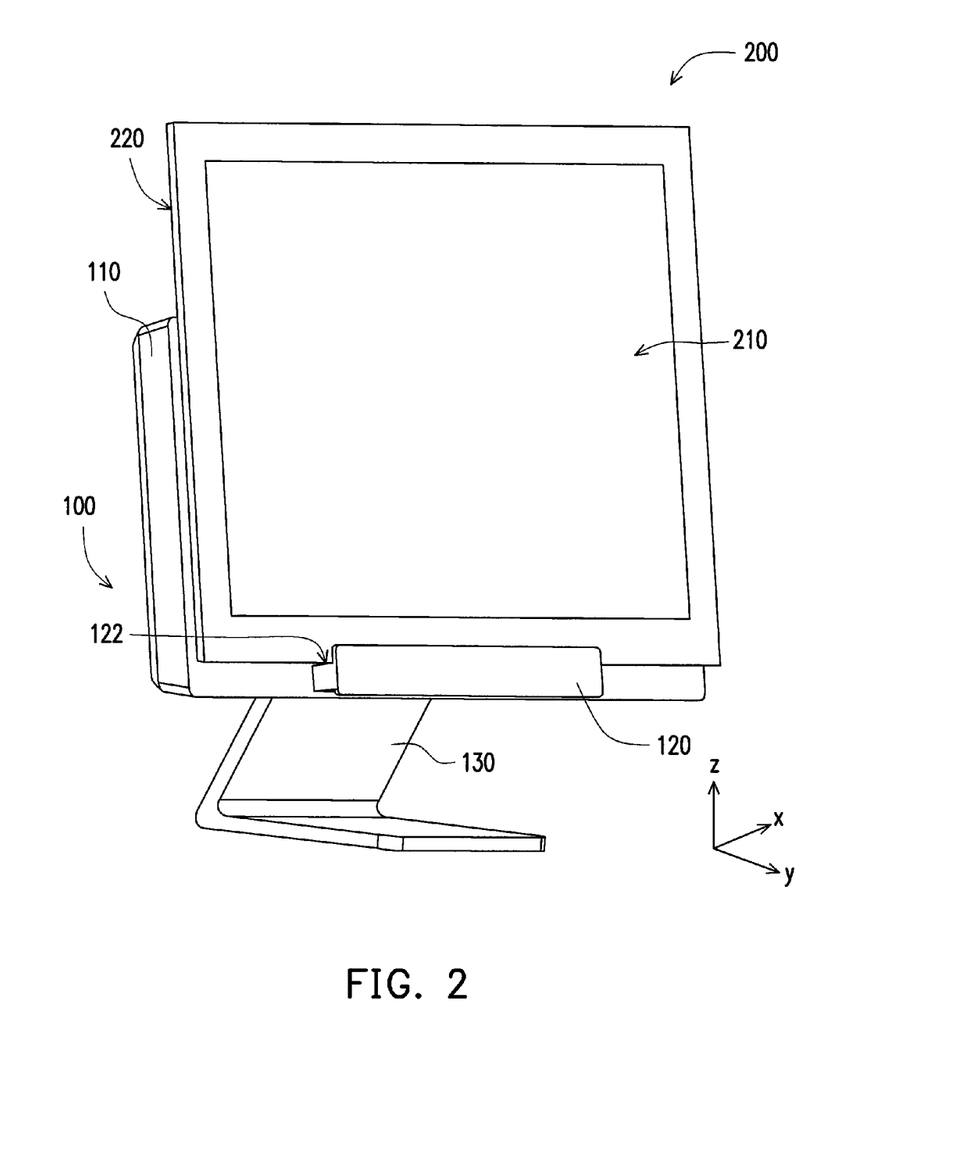
FIG. 2 is a schematic diagram showing an assembly of the electronic device and the portable electronic device in FIG. 1.

FIG. 1 is a schematic diagram showing an electronic device and a portable electronic device in a first embodiment. FIG. 2 is a schematic diagram showing an assembly of the electronic device and the portable electronic device in FIG. 1. Please refer to FIG. 1 and FIG. 2, the electronic device 100 with a calculation function is detachably connected to a portable electronic device 200 with the calculation function.

In the embodiment, the portable electronic device 200 is a display device with the calculation function, such as a tablet computer or a mobile phone, and the electronic device 100 may be a host of an AIO computer, which is not limited herein.

The electronic device 100 includes a body 110, a connecting base 120 and a supporter 130. The body 110 has a first surface 112. The connecting base 120 is disposed at the first surface 112 and includes a containing cavity 122. The portable electronic device 200 is placed in the containing cavity 122 along a connecting direction D1 to be electrically connected to the electronic device 100, and the containing cavity 122 exposes a display panel 210 of the portable electronic device 200, as shown in FIG. 2.

The connecting base 120 includes a first connecting interface 128 disposed in the containing cavity 122, and the portable electronic device 200 includes a second connecting interface 250 correspondingly. When the portable electronic device 200 is placed in the containing cavity 122, the first connecting interface 128 is connected to the second connecting interface 250. The first connecting interface 128 and the second connecting interface 250 may be physical connecting ports or virtual connecting interfaces, such as a wireless transmission module, which is not limited herein.

When the electronic device 100 is connected to the portable electronic device 200 and if the electronic device 100 also includes a display screen, a first operating image displayed by the display panel 210 of the portable electronic device 200 is switched to a second operating image of the electronic device 100, and one of the electronic device 100 and the portable electronic device 200 which has a better calculation function takes charge of the main processing and the calculation.

The electronic device 100 may be a host of an AIO computer which does not include a display screen, and the portable electronic device 200 may be a tablet computer and is electrically connected to the electronic device 100 to be used as the display screen. The electronic device 100 may also be an AIO computer with the display screen, and the portable electronic device 200 may be a display device with a larger display screen and a calculation function to be used as the display screen of the electronic device 100. Thus, the mobility, the functionality and the flexibility in use of the electronic device 100 and the portable electronic device 200 are improved.

The electronic device 100 further includes a first magnetic element 140 disposed in the body 110, and the portable electronic device 200 further includes a second magnetic element 230 disposed in the back surface. A magnetic force of attraction is generated between the first magnetic element 140 and the second magnetic element 230, and they are disposed corresponding to each other. Thus, the portable electronic device 200 is fixed to the body 110 of the electronic device 100 via the magnetic force of attraction between the first magnetic element 140 and the second magnetic element 230, which is not limited herein.

In the embodiment, the connecting base 120 further includes at least one positioning post 126 disposed at the containing cavity 122, and the portable electronic device 200 includes at least one fixing hole 240 corresponding to the positioning post 126. When the portable electronic device 200 is placed in the containing cavity 122, the positioning post 126 is inserted to the fixing hole 240 to fix the portable electronic device 200 to the body 110 of the electronic device 100, which is not limited herein.

When the portable electronic device 200 is placed in the containing cavity 122 and connected to the electronic device 100, the electronic device 100 supports the portable electronic device 200 via the containing cavity 122, and prevents the portable electronic device 200 from moving along a Z direction shown in FIG. 2. The magnetic force between the first magnetic element 140 and the second magnetic element 230 prevents the portable electronic device 200 from moving along a Y direction, and the electronic device 100 prevents the portable electronic device 200 from moving along an X direction via the positioning post 126 and the fixing hole 240. Thus, the portable electronic device 200 is firmly fixed to the electronic device 100.

Figure 3:
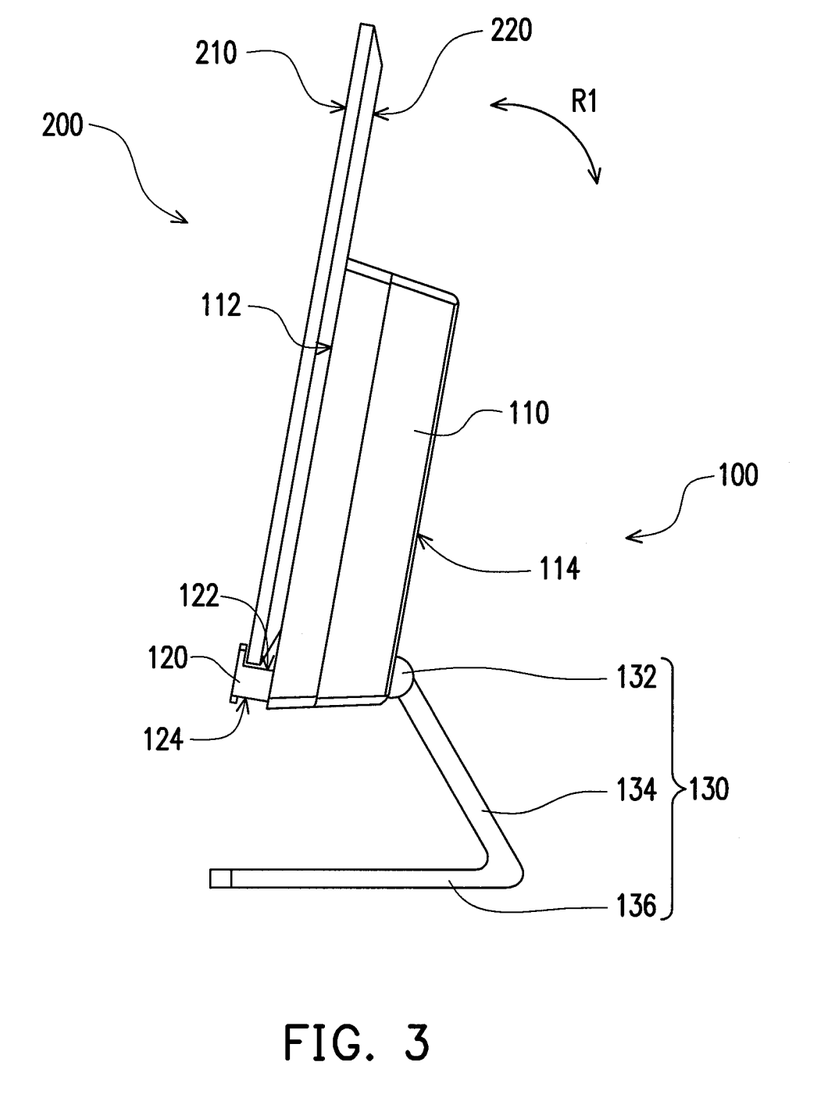
FIG. 3 is a side view showing the assembly of the electronic device and the portable electronic device in FIG. 2.

FIG. 3 is a side view showing the assembly of the electronic device and the portable electronic device in FIG. 2. As shown in FIG. 3, a bottom surface 124 of the connecting base 120 is vertical to the first surface 112. When the portable electronic device 200 is placed in the containing cavity 122, a back surface 220 opposite to the display panel 210 leans against the first surface 112 of the body 110.

The supporter 130 is pivotally connected to the body 110 to rotate around a first pivotally rotating direction R1 relatively to the body 110 and support the body 110, and an angle is formed therebetween. The body 110 further has a second surface 114 relative to the first surface 112, and the supporter 130 is disposed at the second surface 114. Thus, the user can adjust the angle between the portable electronic device 200 and the electronic device 100 via the supporter 130 to form the best angle of view.

The supporter 130 includes a first pivot 132, a support arm 134 and a base 136. The support arm 134 is connected to the base 136 and pivotally connected to the body 110 via the first pivot 132, and thus the support arm 134 can rotate relatively to the body 110 to adjust the angle between the portable electronic device 200 and the electronic device 100. The base 136 supports the body 110. In the embodiment, the support arm 134 and the base 136 may be integrated formed.

Figure 4:
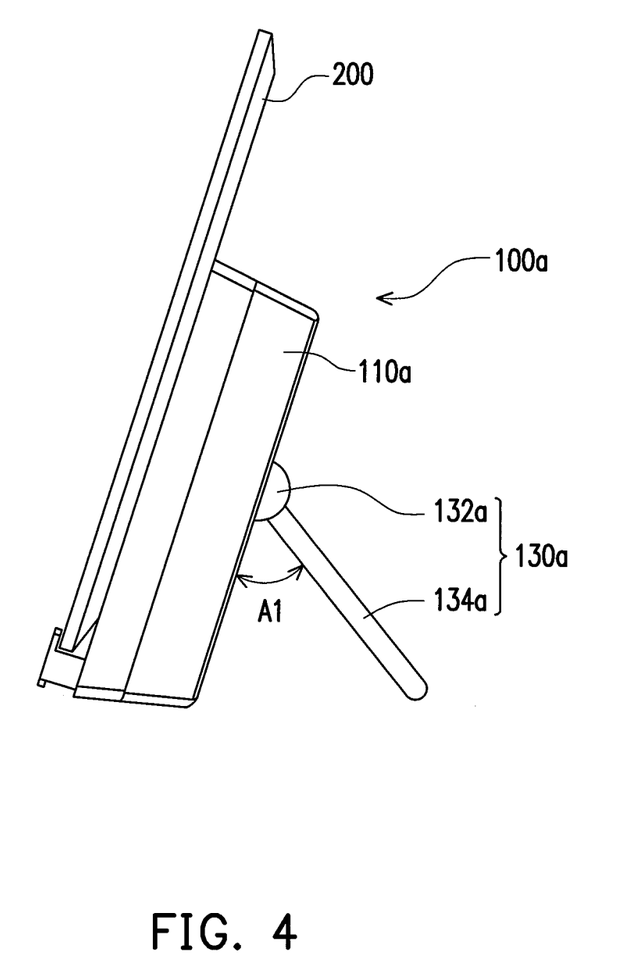
FIG. 4 is a side view showing an assembly of an electronic device and a portable electronic device in a second embodiment.

FIG. 4 is a side view showing an assembly of an electronic device and a portable electronic device in a second embodiment. Please refer to FIG. 4, in the embodiment, the supporter 130a includes a first pivot 132a and a support arm 134a. The support arm 134a is pivotally connected to the body 110a via the first pivot 132a to rotate relatively to the body 110a and support it.

Thus, an angle A1 between the support arm 134a and the body 110a can be adjusted via the first pivot 132a, so as to adjust a disposing angle of the portable electronic device 200 and the electronic device 100a to form the best angle of view for the user. The supporter is not limited as long as the disposing angle of the portable electronic device and the electronic device can be adjusted via the supporter pivotally connected to the body, which is not limited herein.

Figure 5:
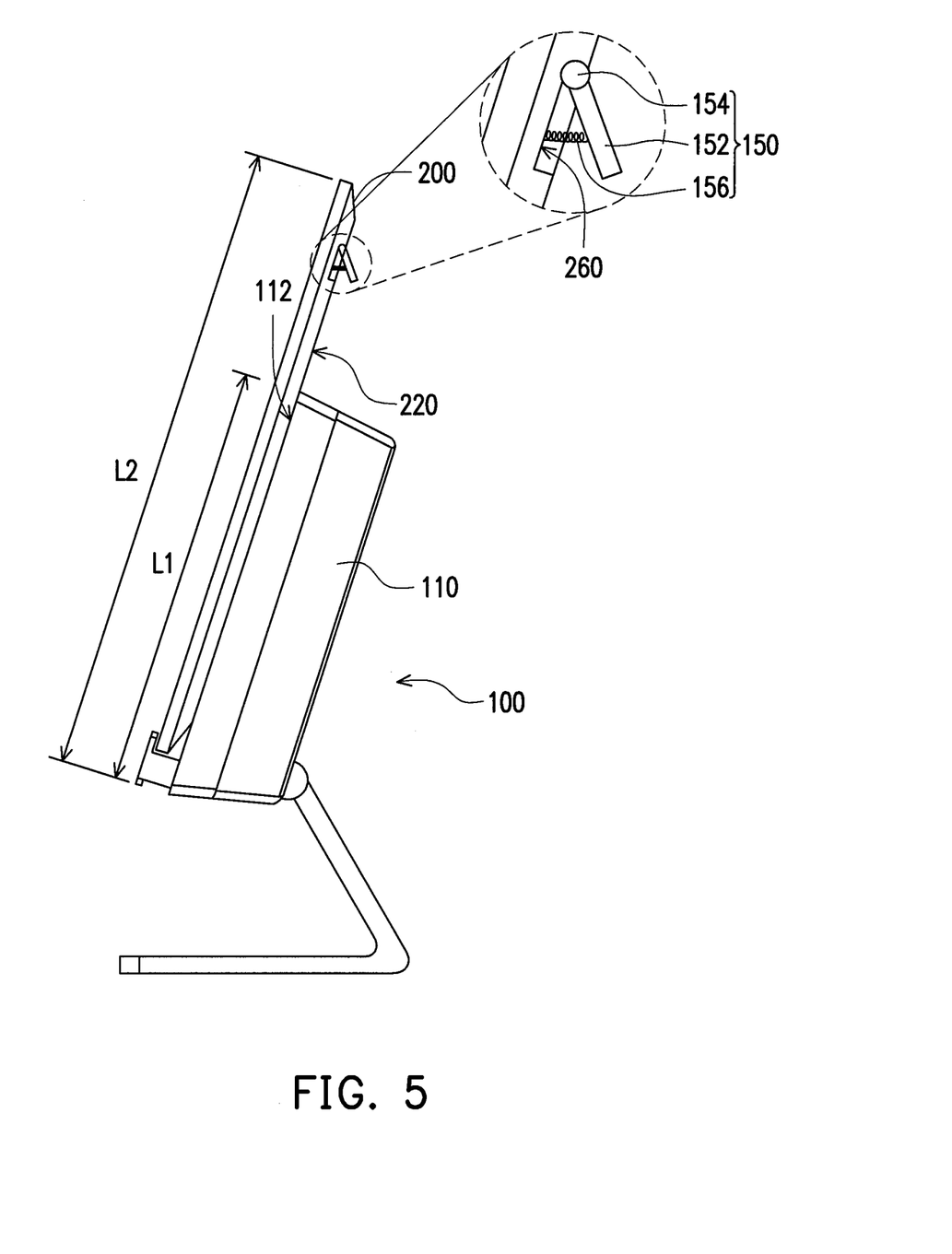
FIG. 5 is a side view showing an assembly of an electronic device and a portable electronic device in a third embodiment.
Figure 6:
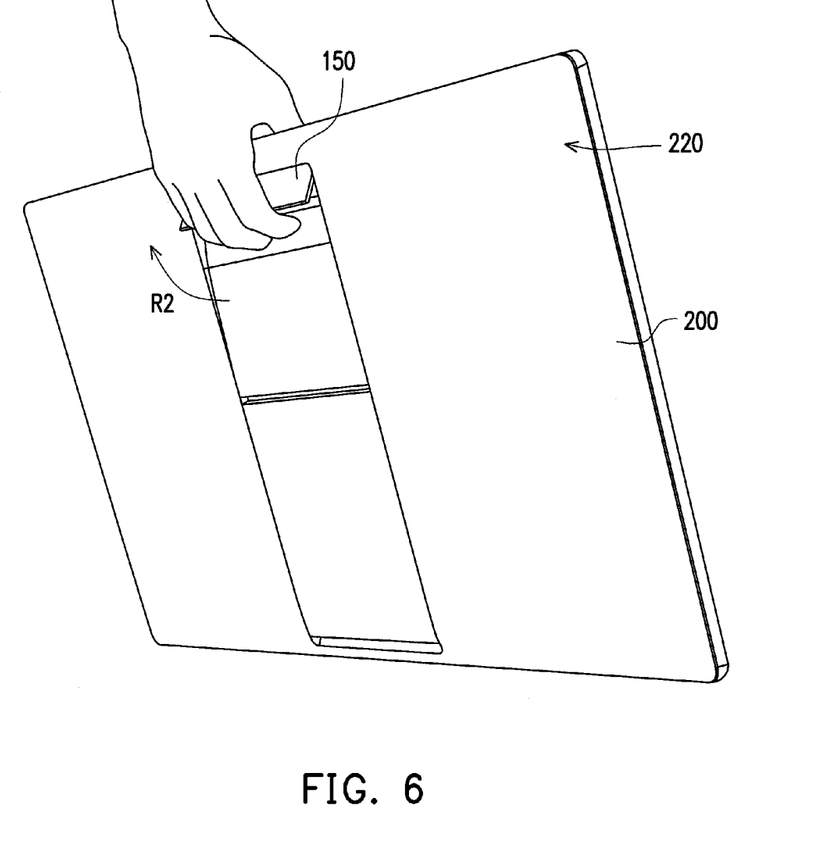
FIG. 6 is a schematic diagram showing the portable electronic device in FIG. 5.

FIG. 5 is a side view showing an assembly of an electronic device and a portable electronic device in a third embodiment. FIG. 6 is a schematic diagram showing the portable electronic device in FIG. 5. Please refer to FIG. 5 and FIG. 6, in the embodiment, the portable electronic device 200 further includes a handle structure 150, and the length of a first side L1 of the first surface 112 is smaller than the length of a second side L2 of the back surface 220 of the portable electronic device 200. Thus, when the portable electronic device 200 is connected to the electronic device 100, a part of the back surface 220 of the portable electronic device 200 is exposed from the first surface 112 of the electronic device 100. The handle structure 150 of the portable electronic device 200 is disposed at a part of the back surface 200 which is exposed from the first surface 112, and the user can lift the portable electronic device 200 connected to the electronic device 100 via the handle structure 150.

The handle structure 150 includes a handle 152, a second pivot 154 and an elastic reset element 156. The handle 152 is pivotally connected to the back surface 220 via the second pivot 154 to rotate relatively to the back surface 220 along a second pivotally rotating direction R2, and when the handle 152 is rotated to a fixed position, it is locked to facilitate the user lifting or holding. The fixed position may be a position when the angle between the handle 152 and the back surface 220 is 30 degrees, which is not limited herein.

The elastic reset element 156 is connected between the back surface 220 and the handle 152. When the user put down the handle structure 150, the handle 152 restores to the original position via the elastic reset element 156. Moreover, the portable electronic device 200 further includes a concave portion 260 formed at the back surface 220 to accommodate the handle structure 150. When the handle 152 does not rotate out of the back surface 220 (which means the handle 152 is at the original state), the outer surface of the handle 152 is coplanar with the back surface 220 to keep a smooth appearance of the portable electronic device 200.

Furthermore, since when the portable electronic device 200 is connected to the electronic device 100, a part of the back surface 220 of the portable electronic device 200 is exposed from the first surface 112 of the electronic device 100 as shown in FIG. 5, which means not the whole back surface 220 of the portable electronic device 200 leans against the first surface 112, and if the portable electronic device 200 has large size or it is hit, it may be toppled.

Thus, the electronic device 100 further includes a first fixing part disposed at the body 110 to limit the portable electronic device 200 moving along the Y-direction. The portable electronic device 200 further includes a second fixing part disposed at the back surface 220. When the portable electronic device 200 is placed in the containing cavity 122, the first fixing part is locked with the second fixing part to fix the portable electronic device 200 to the electronic device 100. The first fixing part and the second fixing part are illustrated with examples in the following.

Figure 7A:
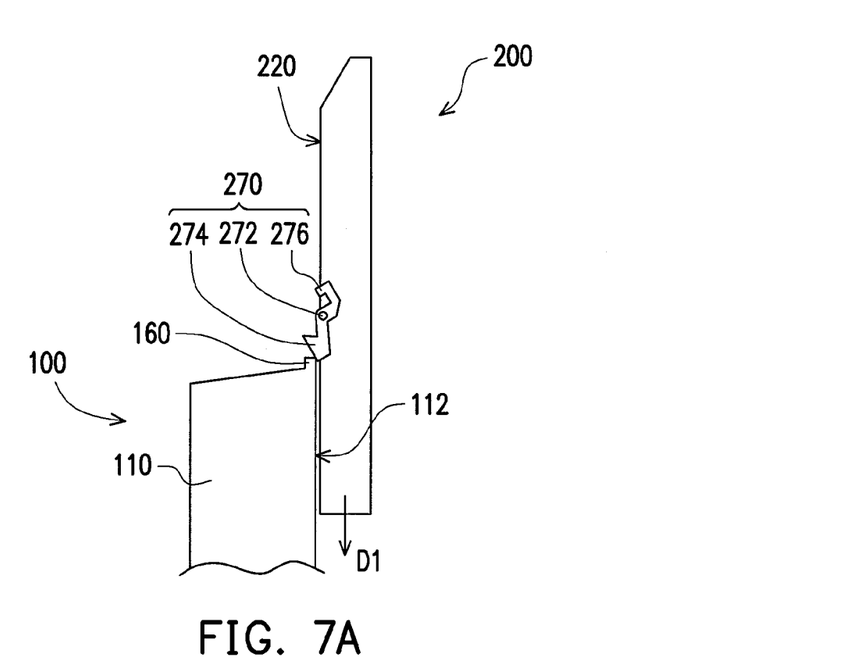
FIG. 7A is a schematic diagram showing a first fixing part and a second fixing part at an original state.
Figure 7B:
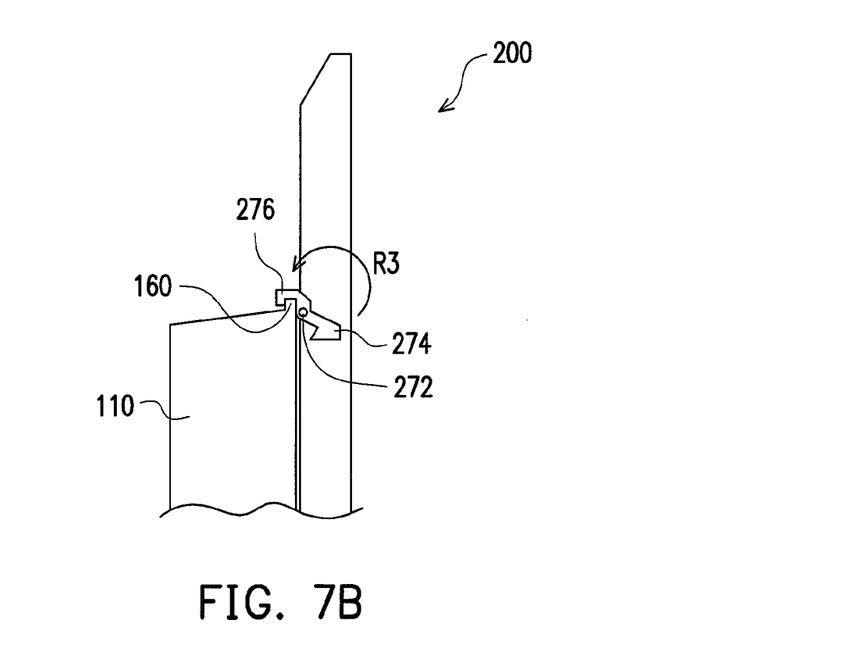
FIG. 7B is a schematic diagram showing the first fixing part and the second fixing part in FIG. 7A at a locking state.

FIG. 7A is a schematic diagram showing a first fixing part and a second fixing part at an original state. FIG. 7B is a schematic diagram showing the first fixing part and the second fixing part in FIG. 7A at a locking state. Please refer to FIG. 7A and FIG. 7B, in the embodiment, the first fixing part 160 is a protruding part formed at a top surface of the body 110 connected to the first surface 112.

The second fixing part 270 includes a pivot rotating part 272, an actuating part 274 and a locking part 276. As shown in FIG. 7A, the pivot rotating part 272 is connected to the actuating part 274 and the locking part 276, and the second fixing part 270 is pivotally connected to the back surface 220 via the pivot rotating part 272 to rotate relatively to the back surface 220 between the original state in FIG. 7A and the locking state in FIG. 7B. When the second fixing part 270 is at the original state, the actuating part 274 protrudes from the back surface 220 as shown in FIG. 7A.

When the portable electronic device 200 is connected to the electronic device 100 along the connecting direction D1, the first surface 112 of the body 110 pushes the actuating part 274 to rotate along a third pivotally rotating direction R3, and the second fixing part 270 rotates to the locking state as shown in FIG. 7B. The locking part 276 protrudes from the back surface 220 to lock with the protruding part of the first fixing part 160.

Figure 8A:
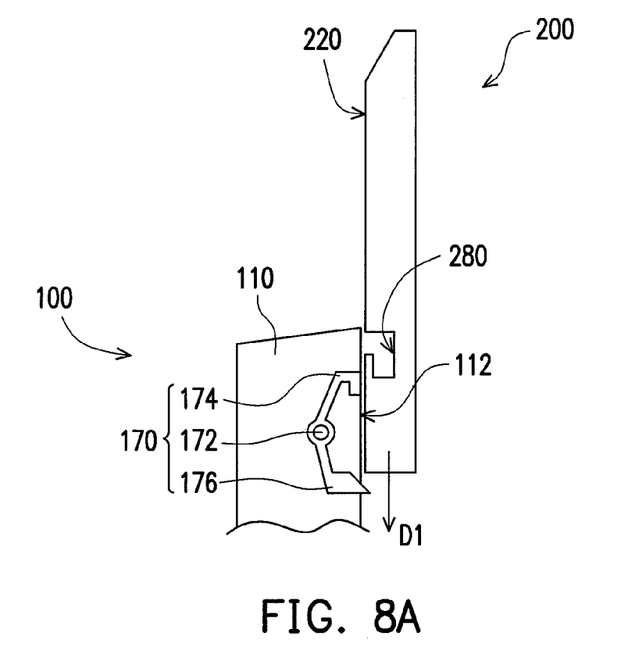
FIG. 8A is a schematic diagram showing a first fixing part and a second fixing part at an original state.
Figure 8B:
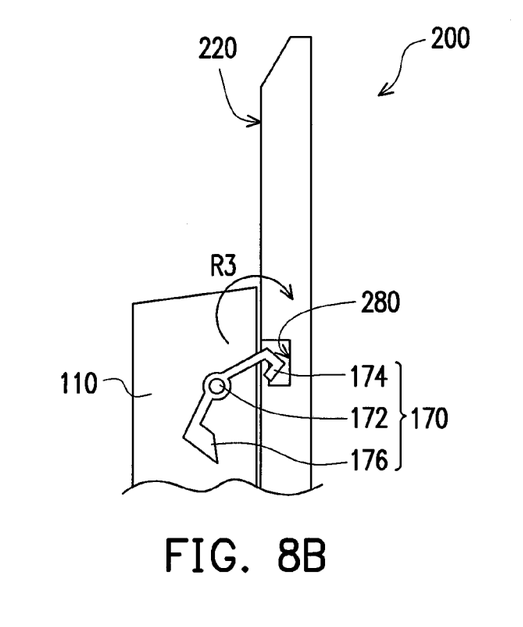
FIG. 8B is a schematic diagram showing the first fixing part and the second fixing part in FIG. 8A at a locking state.

FIG. 8A is a schematic diagram showing a first fixing part and a second fixing part at an original state. FIG. 8B is a schematic diagram showing the first fixing part and the second fixing part in FIG. 8A at a locking state. Please refer to FIG. 8A and FIG. 8B, in the embodiment, the first fixing part 170 includes a pivot rotating part 172, an actuating part 176 and a locking part 174. The pivot rotating part 172 is connected to the actuating part 176 and the locking part 174 as shown in FIG. 8A, and the first fixing part 170 is pivotally connected to the first surface 112 via the pivot rotating part 172 to rotate relatively to the first surface 112 between the original state in FIG. 8A and the locking state in FIG. 8B.

The second fixing part 280 is a groove formed at the back surface 220. When the first fixing part 170 is at the original state, the actuating part 176 protrudes from the first surface 112. When the portable electronic device 200 is connected to the electronic device 100 along the connecting direction D1, the back surface 220 of the portable electronic device 200 pushes the actuating part 176 to rotate along the third pivotally rotating direction R3 into the body 110, and the first fixing part 170 rotates to the locking state. The locking part 174 protrudes from the first surface 112 to lock to the groove of the second fixing part 280.

Figure 9A:
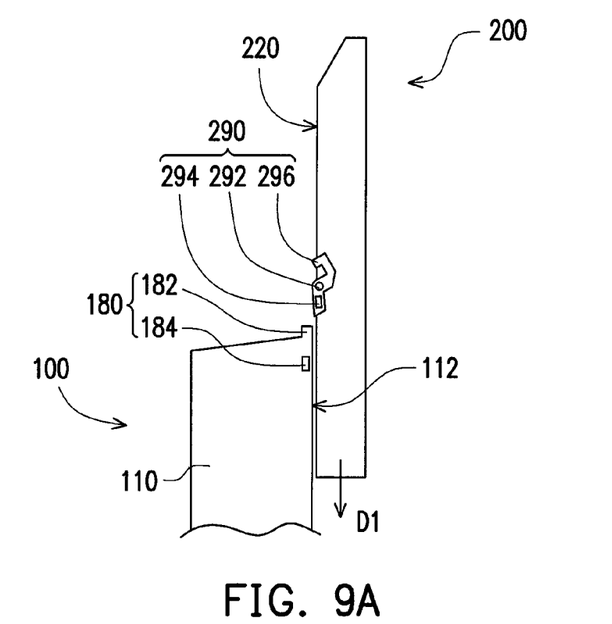
FIG. 9A is a schematic diagram showing a first fixing part and a second fixing part at an original state.
Figure 9B:
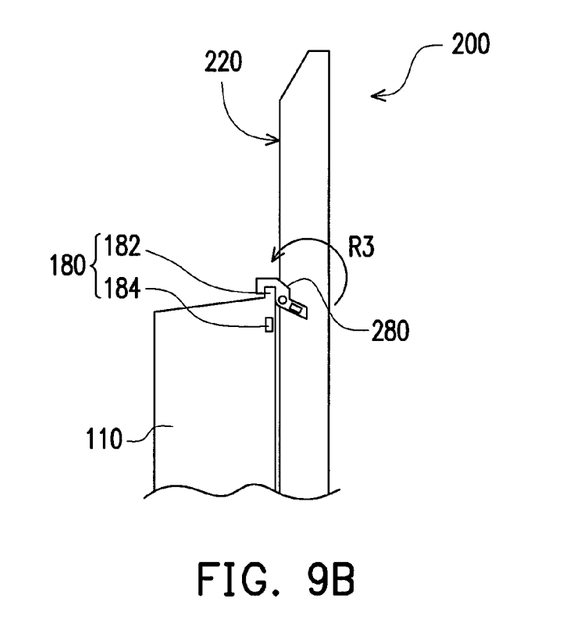
FIG. 9B is a schematic diagram showing the first fixing part and the second fixing part in FIG. 9A at a locking state.

FIG. 9A is a schematic diagram showing a first fixing part and a second fixing part at an original state. FIG. 9B is a schematic diagram showing the first fixing part and the second fixing part in FIG. 9A at a locking state. Please refer to FIG. 9A and FIG. 9B, in the embodiment, the first fixing part 180 includes a protruding part 182 and a magnetic element 184. The magnetic element 184 is disposed at the first surface 112, and the protruding part 182 is formed at the top surface of the body 110c connected to the first surface 112.

The second fixing part 290 includes a pivot rotating part 292, a magnetic part 294 and a locking part 296. A magnetic force of repulsion is generated between the magnetic part 294 and the magnetic element 184. The pivot rotating part 292 is connected to the magnetic part 294 and the locking part 296, and the second fixing part 290 is pivotally connected to the back surface 220 via the pivot rotating part 292 to rotate relatively to the back surface 220 between the original state in FIG. 9A and the locking state in FIG. 9B.

When the second fixing part 290 is at the original state in FIG. 9A, the magnetic part 294 is substantially coplanar with the back surface 220. When the portable electronic device 200 is connected to the electronic device 100, the magnetic part 294 moves into the portable electronic device 200 due to the magnetic force of repulsion of the magnetic element 184, and drives the second fixing part 290 to rotate along the third pivotally rotating direction R3 to the locking state in FIG. 9B. The locking part 296 protrudes from the back surface 220 to lock with the protruding part 182.

Figure 10A:
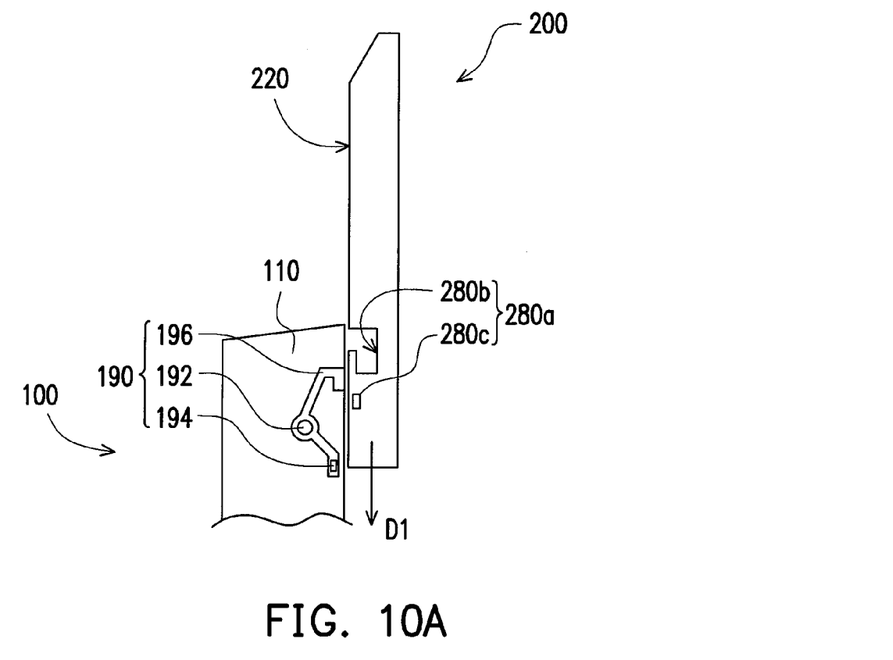
FIG. 10A is a schematic diagram showing a first fixing part and a second fixing part at an original state.
Figure 10B:
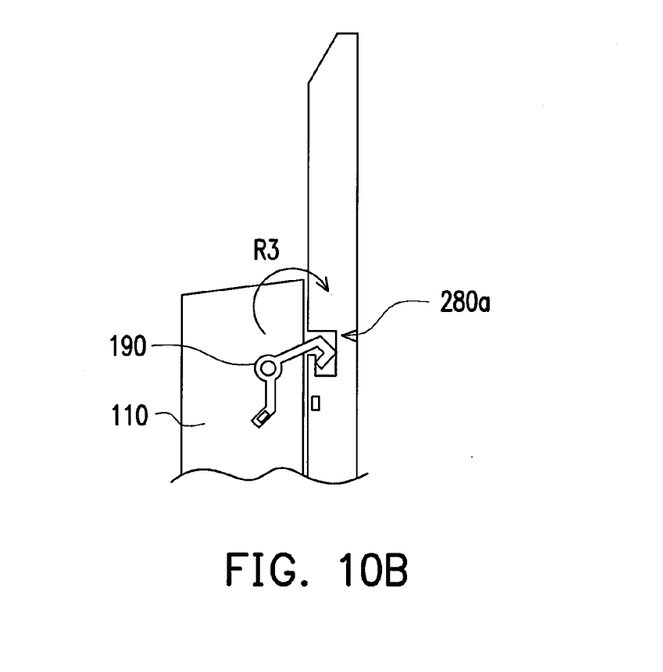
FIG. 10B is a schematic diagram showing the first fixing part and the second fixing part in FIG. 10A at a locking state.

FIG. 10A is a schematic diagram showing a first fixing part and a second fixing part at an original state. FIG. 10B is a schematic diagram showing the first fixing part and the second fixing part in FIG. 10A at a locking state. Please refer to FIG. 10A and FIG. 10B, in the embodiment, the first fixing part 190 includes a pivot rotating part 192, a magnetic part 194 and a locking part 196. The pivot rotating part 192 is connected to the magnetic part 194 and the locking part 196 as shown in FIG. 10A. The first fixing part 190 is pivotally connected to the first surface 112 via the pivot rotating part 192 to rotate relatively to the first surface 112 between the original state in FIG. 10A and the locking state in FIG. 10B.

The second fixing part 280a includes a groove 280b and a magnetic element 280c which are disposed at the back surface 220, and the magnetic force of repulsion is generated between the magnetic part 194 and the magnetic element 280c. When the first fixing part 190 is at the original state, the magnetic part 194 is substantially coplanar with the first surface 112.

When the portable electronic device 200 is connected to the electronic device 100 along the connecting direction D1, the magnetic part 194 moves into the body 110 due to the magnetic force of repulsion of the magnetic element 280c, and drives the first fixing part 190 to rotate to the locking state in FIG. 10B along the third pivotally rotating direction R3. The locking part 196 protrudes from the first surface 112 to lock to the groove 280b.

To sum up, the connecting base is disposed at the electronic device to make the bottom surface of the connecting base substantially vertical to the first surface of the electronic device. The connecting base includes the containing cavity for holding the portable electronic device. Thus, the portable electronic device can be detachably and electrically connected to the electronic device via the connecting base. When the electronic device is electrically connected to the portable electronic device, the one with better calculation function takes charge of the main processing and calculation. Thus, the mobility, the functionality and the flexibility of the electronic device and the portable electronic device are improved.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. An electronic device having a calculation function and detachably connected to a portable electronic device having the calculation function, the electronic device comprising: a body having a first surface; a connecting base disposed at the body and including a containing cavity, wherein the portable electronic device is capable of being disposed in the containing cavity to be electrically connected to the electronic device, and a back surface of the portable electronic device leans against the first surface; a supporter including a first pivot; the supporter disposed at the body and supporting the body, wherein an angle is formed between the supporter and the body; and a handle structure disposed at the back surface exposed out of the first surface wherein the handle structure includes a handle, a second pivot and an elastic reset element, the handle is pivotally connected to the back surface via the second pivot to rotate relatively to the back surface, and the elastic reset element is connected between the back surface and the handle.

2. The electronic device according to claim 1, wherein the electronic device further includes a first magnetic element disposed in the body, the portable electronic device further includes a second magnetic element disposed at the back surface, and a magnetic force of attraction is generated between the first magnetic element and the second magnetic element to fix the portable electronic device to the body.

3. The electronic device according to claim 1, wherein the connecting base further includes a positioning post disposed in the containing cavity, the portable electronic device further includes a fixing hole corresponding to the positioning post, when the portable electronic device is disposed in the containing cavity, and the positioning post is embedded into the fixing hole to fix the portable electronic device to the body.

4. The electronic device according to claim 1, wherein the connecting base includes a first connecting interface disposed in the containing cavity, the portable electronic device includes a second connecting interface corresponding to the first connecting interface, and when the portable electronic device is disposed in the containing cavity, the first connecting interface is connected to the second connecting interface.

5. The electronic device according to claim 1, wherein the body further has a second surface corresponding to the first surface, and the supporter is disposed at the second surface.

6. The electronic device according to claim 1, wherein the supporter includes the first pivot and a support arm, and the support arm is pivotally connected to the body via the first pivot, the support arm rotates relatively to the body and support the body.

7. The electronic device according to claim 1, wherein the supporter includes the first pivot, a support arm and a base, the support arm is connected to the base and is pivotally connected to the body via the first pivot, the support arm rotates relatively to the body, and the base supports the body.

8. The electronic device according to claim 1, wherein length of a first side of the first surface is smaller than length of a second side of the back surface to make a part of the back surface of the portable electronic device exposed out of the first surface of the electronic device.

9. The electronic device according to claim 1, wherein the portable electronic device further includes a concave portion at the back surface to accommodate the handle structure, and when the handle does not rotate out from the back surface, an outer surface of the handle is coplanar with the back surface.

10. The electronic device according to claim 1, wherein the electronic device further includes a first fixing part disposed at the body, the portable electronic device further includes a second fixing part disposed at the back surface, when the portable electronic device is connected to the electronic device, the first fixing part is connected to the second fixing part to fix the portable electronic device to the electronic device.

11. The electronic device according to claim 10, wherein the first fixing part is a protruding part formed at a top surface of the body connected to the first surface, the second fixing part includes a pivot rotating part, an actuating part and a locking part, the pivot rotating part is connected to the actuating part and the locking part, the second fixing part is pivotally connected to the back surface via the pivot rotating part to rotate between an original state and a locking state relatively to the back surface, when the second fixing part is at the original state, the actuating part protrudes from the back surface, when the portable electronic device is connected to the electronic device, the body pushes the actuating part and the second fixing part rotates to the locking state, and the locking part protrudes from the back surface and is locked with the protruding part.

12. The electronic device according to claim 10, wherein the first fixing part includes a pivot rotating part, an actuating part and a locking part, the pivot rotating part is connected to the actuating part and the locking part, the first fixing part is pivotally connected to the first surface via the pivot rotating part to rotate between an original state and a locking state relatively to the first surface, the second fixing part is a groove formed at the back surface, when the first fixing part is at the original state, the actuating part protrudes from the first surface, when the portable electronic device is connected to the electronic device, the portable electronic device pushes the actuating part and the first fixing part rotates to the locking state, and the locking part protrudes from the first surface and is locked to the groove.

13. The electronic device according to claim 10, wherein the first fixing part includes a protruding part and a magnetic element, the magnetic element is disposed at the first surface, the protruding part is formed at a top surface connected to the first surface, the second fixing part includes a pivot rotating part, a magnetic part and a locking part, a magnetic force of repulsion is generated between the magnetic part and the magnetic element, the pivot rotating part is connected to the magnetic part and the locking part, the second fixing part rotates relatively to the back surface via the pivot rotating part, when the portable electronic device is connected to the electronic device, the magnetic force of repulsion between the magnetic part and the magnetic element drives the second fixing part to rotate, and the locking part protrudes from the back surface and is locked with the protruding part.

14. The electronic device according to claim 10, wherein the first fixing part includes a pivot rotating part, a magnetic part and a locking part, the pivot rotating part is connected to the magnetic part and the locking part, the first fixing part rotates relatively to the first surface via the pivot rotating part, the second fixing part includes a groove and a magnetic element which are disposed at the back surface, respectively, a magnetic force of repulsion is generated between the magnetic part and the magnetic element, when the portable electronic device is connected to the electronic device, the magnetic force of repulsion between the magnetic part and the magnetic element drives the first fixing part to rotate, and the locking part protrudes from the first surface and is locked to the groove.

\* \* \* \* \*